US008760366B2

(12) United States Patent
Morris et al.

(10) Patent No.: US 8,760,366 B2
(45) Date of Patent: Jun. 24, 2014

(54) METHOD AND SYSTEM FOR REMOTE COMPUTING

(75) Inventors: Simon Edward Morris, Kirkland, WA (US); James Peter Walch, Sheffield (GB)

(73) Assignee: RealVNC Ltd., Cambridge (GB)

( * ) Notice: Subject to any disclaimer, the term of this patent is extended or adjusted under 35 U.S.C. 154(b) by 0 days.

(21) Appl. No.: 13/641,665

(22) PCT Filed: Nov. 22, 2011

(86) PCT No.: PCT/GB2011/052286
§ 371 (c)(1),
(2), (4) Date: Mar. 19, 2013

(87) PCT Pub. No.: WO2012/080713
PCT Pub. Date: Jun. 21, 2012

(65) Prior Publication Data
US 2013/0249774 A1    Sep. 26, 2013

(30) Foreign Application Priority Data
Dec. 14, 2010   (GB) .................................. 1021259.5

(51) Int. Cl.
*G09G 5/00* (2006.01)
(52) U.S. Cl.
USPC ............................................ 345/2.1; 345/2.3
(58) Field of Classification Search
USPC .................................................. 345/2.1–2.3
See application file for complete search history.

(56) References Cited

U.S. PATENT DOCUMENTS

| 6,324,305 | B1 | 11/2001 | Holladay et al. |
| 6,825,846 | B2 * | 11/2004 | Mondal .......................... 345/547 |
| 7,016,547 | B1 | 3/2006 | Smirnov |
| 7,218,784 | B1 | 5/2007 | Zeck et al. |
| 2003/0048954 | A1 | 3/2003 | Matthews |
| 2003/0110244 | A1 * | 6/2003 | Mondal .......................... 709/223 |

(Continued)

FOREIGN PATENT DOCUMENTS

| EP | 1412936 | 8/2002 |
| EP | 1521452 | 4/2005 |
| JP | 2008109478 | 5/2008 |

OTHER PUBLICATIONS

Lin, Tony et al., "Hybrid Image Coding for Real-Time Computer Screen Video Transmission," Proceedings of SPIE, Visual Communications and Image Processing 2004, vol. 5308, No. 1, pp. 946-957, Jan. 7, 2004.

(Continued)

*Primary Examiner* — Dmitriy Bolotin
(74) *Attorney, Agent, or Firm* — Sheppard, Mullin, Richter & Hampton LLP

(57) ABSTRACT

A remote computer having a processor and a display, said remote computer being connected via a network to a local computer having a processor and a display, wherein the processor of the remote computer is configured to divide at least part of the remote computer display into a grid having a plurality of tiles, determine whether each tile represents image data or text data, encode each tile representing text data using a lossless compression, encode each tile representing image data using a lossy compression, and transmit display data comprising said lossy encoded image data and said lossless encoded text data from said remote computer to said local computer, whereby a user is able to view said remote computer display on said local computer display.

16 Claims, 4 Drawing Sheets

(56) References Cited

U.S. PATENT DOCUMENTS

| | | |
|---|---|---|
| 2004/0017939 A1 | 1/2004 | Mehrotra |
| 2007/0140575 A1 | 6/2007 | Bai et al. |
| 2007/0206868 A1 | 9/2007 | Nakayama |
| 2007/0263009 A1 | 11/2007 | Li et al. |
| 2008/0137751 A1 | 6/2008 | Roman |
| 2010/0027882 A1 | 2/2010 | Matsuoka |
| 2010/0296730 A1 | 11/2010 | Matsuoka |
| 2012/0001832 A1* | 1/2012 | Braghis et al. ............... 345/2.2 |

OTHER PUBLICATIONS

Application No. GB1021259.5, Search Report, Apr. 15, 2011.

Application No. GB1021259.5, Further Search Report, Aug. 19, 2011.

Application No. GB1021259.5, Examination Report, Oct. 24, 2011.

International Application No. PCT/GB20111052286, International Search Report and Written Opinion, Mar. 28, 2012.

* cited by examiner

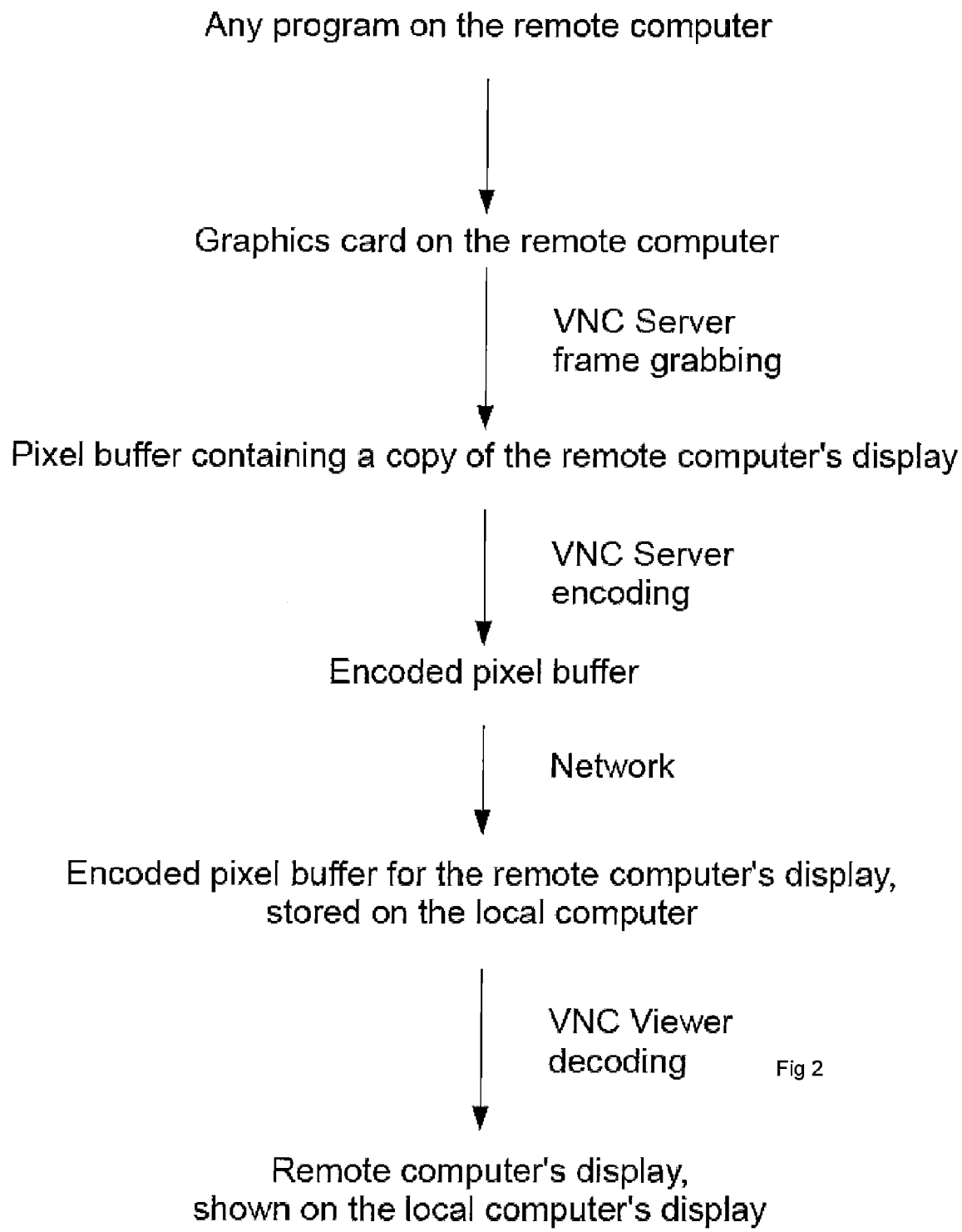

METHOD AND SYSTEM FOR REMOTE COMPUTING

CROSS-REFERENCE TO RELATED APPLICATIONS

This application is a continuation of International Application No. PCT/GB2011/052286 filed Nov. 22, 2011 and published as WO 2012/080713 A1, entitled "Method and System for Encoding Display Data," which claims priority to GB Patent Application Serial No. 1021259.5, filed Dec. 14, 2010, now GB Patent No. 2481870, which are all incorporated by reference herein.

FIELD OF THE INVENTION

This invention relates to a method and system for remote computing.

BACKGROUND TO THE INVENTION

It is known to use a local computer or similar device to interact with a physically remote computer. For the individual user, one common scenario is to help troubleshoot the computer of a distant less-technically-savvy relative. Sitting at your desk in Baltimore, remote computing allows a user to take control of a relative's PC in California and show them how to use a new software package by actually doing it from your PC in Baltimore. A very common business application is in remote system administration, where it is used to allow administrators to take control of employee machines to diagnose and fix problems. In all scenarios, key presses, mouse movements, and mouse clicks are sent from the local computer to the remote computer to effect changes on the remote computer. A continually updated copy of the remote computer's display is shown in a window on the local computer. Accordingly, it appears to a user that they are sitting in front of the remote computer even though it is at a different location.

The continually updated copy is achieved by encoding pixel data describing the contents of the remote computer's display and transmitting this data, or any changes in this data, to the local computer. There are many ways of achieving this encoding. At one end of the range, there is Raw encoding which has no data compression and thus requires minimal CPU overhead at the remote computer but is only suitable for fast networks because of the large volume of data to be transmitted. At the other end of the range, there is high compression encoding (e.g. Run Length Encoding RLE or variations thereof) which offer better compression and are suitable for slower networks but require higher CPU overhead. These standard encodings are all lossless and thus the display on the local computer is an exact representation of the display on the remote computer.

Typically the display on the remote computer comprises a mixture of text and image data. The amount of image data has increased in recent years to include more images and video; and because of the trend towards semi-transparent and blurred window frames, and highly textured or graduated color backgrounds and fill patterns.

There is a strong temporal element to remote computing; the algorithms producing and transmitting the continually updated copy of the remote computer display have to be fast enough to keep up with the changes on the remote computer without falling behind. A bottleneck may arise from the encoding time, the data communication time, or the decoding time.

The present applicant has recognized the need for an improved encoding.

SUMMARY OF THE INVENTION

According to a first aspect of the invention, there is provided a method of transmitting display data from a remote computer to a local computer having a display whereby a user is able to view said remote computer display data on said local computer display, the method comprising dividing at least part of the remote computer display data into a plurality of tiles; determining whether each tile represents image data or text data by applying a color reduction algorithm to each said tile to produce a color-reduced tile and comparing each tile with its corresponding color reduced tile; encoding each tile representing text data using a lossless compression; encoding each tile representing image data using a lossy compression, wherein said transmitted display data comprises said lossy encoded image data and said lossless encoded text data.

According to a second aspect of the invention, there is provided a remote computer comprising a processor which is configured to create display data, said remote computer being connected via a network to a local computer having a processor and a display, wherein the processor of the remote computer is configured to divide at least part of the remote computer display data into a plurality of tiles; determine whether each tile represents image data or text data by applying a color reduction algorithm to each said tile to produce a color-reduced tile and comparing each tile with its corresponding color reduced tile; encode each tile representing text data using a lossless compression; encode each tile representing image data using a lossy compression, and transmit display data comprising said lossy encoded image data and said lossless encoded text data from said remote computer to said local computer, whereby a user is able to view said remote computer display data on said local computer display.

This invention is a hybrid of lossy and lossless encodings, in particular JPEG and a variation of RLE (Run Length Encoding) and thus may be called JRLE. It encodes "image" pixel data using a lossy encoding (JPEG), and "text" pixel data using a lossless encoding (ZRLE). It will be seen that, for display data that is a mixture of "image" and "text", this hybrid will meet the combined criteria detailed below better than either a pure lossy or a pure lossless encoding. In general, text data is characterized by well defined lines and comprises data such as sharp text, line drawings and areas of solid color. By contrast, image data comprises areas of graduated color, fine detail texture, blurred text or blurred lines.

The following features apply to all aspects of the invention.

The remote computer may comprise a physical display, e.g. a display monitor. Alternatively, the remote computer may not be connected to a physical display. In this case, the processor of the remote computer may create a display, such as a standard desktop display, which is rendered into a framestore. The processor may even emit the signals (e.g. VGA or DVI) which would cause said display to be generated on a physical display. However, since there is no physical monitor, this output is not viewed on the monitor. Nevertheless, the display and its framestore still exist and updates are detected and sent out as detailed below.

Said display data may be in the form of pixel data with n being the total number of bits used to represent each pixel in the original pixel data, n may be reduced by 50% (e.g. from 24 to 12) in the color reduction algorithm.

Said determining step may further comprise compressing each said tile using a lossless compression to produce a first encoded copy; compressing said color reduced tile with said lossless compression used in said first encoding step to produce a second encoded copy; comparing said first and second encoded copies to determine whether said tile represents image data or text data, wherein a tile represents image data if the size of the first encoded copy is large relative to the size of the second encoded copy and a tile represents text data if the sizes are approximately equal.

The algorithm for identifying image regions is based on the observation that image regions tend to look bad if the number of colors is reduced. Thus in other words, said determining step may comprise determining whether each tile represents image data or text data by considering color data for each tile. Images tend to be posterized by a reduction in color, gaining wide bands of color. These bands may compress to a smaller amount of data than the original image so the difference in compressed size between a full-color and a color-reduced image will be significant. By contrast, the equivalent difference for a text region will be negligible as they have more sharp edges. Accordingly, using a color reduction algorithm followed by compression may be a useful way to determine whether or not a tile is text or image data. However, other methods are also possible.

The significance of the difference in size may be determined relative to a threshold value. Thus, said comparing step may comprise determining whether the difference in size between said first encoded copy and said second encoded copy is greater than a threshold value, wherein a tile represents image data if the threshold value is exceeded and a tile represents text data if the threshold value is not exceeded. Said threshold value is determined from n (the total number of bits as set out above). For example, if n ranges between 16 and 24, the threshold value may range between 50 and 150. The threshold value may be found heuristically.

As an alternative to compressing the data, other algorithms for choosing between text and image data may be used. Said display data may be in the form of pixel data and said determining step may comprise applying an analysis on the frequency of occurrence of different values of said pixel data.

The plurality of tiles may be arranged in a grid which may have a plurality of rows and columns of tiles. The tiles may overlap. Each tile may have 16 by 16 pixels. Said tiles may be rectangular or any other suitable shape.

The transmitted image data is preferably real-time data whereby a user has an up-to-date view of the remote computer display on his local computer display. The method may comprise determining which regions on the remote computer display have changed and wherein said at least part of the remote computer display comprises said regions which have changed. In this way, only information which has changed is transmitted and the amount of data transmitted is reduced to enable the system to function more efficiently. To avoid bottlenecks, the system may comprise a feedback loop formed by requests coming back from the local computer (e.g. a decoder for decoding the transmitted data). If resources are short, some changes in the remote computer display may be discarded until the next request comes back. Thus it is imperative to make a fast decision on which compression scheme to use, so color reduction followed by a quick lossless algorithm is appropriate.

By enabling a user to view the remote computer display on the local computer display, a user can view any interactions with the remote computer from the local computer.

According to another aspect of the invention, there is provided a method of controlling a remote computer from a local computer, the method comprising linking said local computer and said remote computer, inputting commands in said local computer, transmitting said commands from said local computer to said remote computer to take effect on said remote computer, and transmitting display data from said remote computer as described above.

A remote computing system comprising a local computer having a processor and a display; a remote computer having a processor and a display, and a network linking said local computer and said remote computer, wherein the processor of the remote computer is configured to divide at least part of the remote computer display into a grid having a plurality of tiles; determine whether each tile represents image data or text data by applying a color reduction algorithm to each said tile to produce a color-reduced tile and comparing each tile with its corresponding color reduced tile; encode each tile representing text data using a lossless compression; encode each tile representing image data using a lossy compression, and transmit display data comprising said lossy encoded image data and said lossless encoded text data from said remote computer to said local computer and wherein the processor of the local computer is configured to decode said transmitted display data and display said remote computer display on said local computer display.

Applying a color reduction algorithm to each said tile to produce a color-reduced tile and comparing each tile with its corresponding color reduced tile is a preferred option. Thus according to another aspect of the invention, there is provided a method of transmitting display data from a remote computer to a local computer having a display whereby a user is able to view said remote computer display data on said local computer display, the method comprising dividing at least part of the remote computer display data into a plurality of tiles; determining whether each tile represents image data or text data; encoding each tile representing text data using a lossless compression; encoding each tile representing image data using a lossy compression, wherein said transmitted display data comprises said lossy encoded image data and said lossless encoded text data.

According to another aspect there is also provided a remote computer comprising a processor which is configured to create display data for said remote computer, said remote computer being connected via a network to a local computer comprising a processor and a display, wherein the processor of the remote computer is configured to divide at least part of the remote computer display data into a plurality of tiles; determine whether each tile represents image data or text data; encode each tile representing text data using a lossless compression; encode each tile representing image data using a lossy compression, and transmit display data comprising said lossy encoded image data and said lossless encoded text data from said remote computer to said local computer, whereby a user is able to view said remote computer display data on said local computer display.

According to another aspect there is also provided a remote computing system comprising a local computer having a processor and a display; a remote computer having a processor, and a network linking said local computer and said remote computer, wherein the processor of the remote computer is configured to create display data for said remote computer; divide at least part of the remote computer display data into a plurality of tiles; determine whether each tile represents image data or text data; encode each tile representing text data using a lossless compression; encode each tile representing image data using a lossy compression, and transmit display data comprising said lossy encoded image data and said lossless encoded text data from said remote computer to said local computer and wherein said processor of said local computer is configured to decode said transmitted display data and to display on said local computer display said remote computer display.

Each of these other aspects can be combined with the features listed for the first two aspects.

The invention further provides processor control code to implement the above-described systems and methods, for example on a general purpose computer system or on a digital signal processor (DSP). The code may be provided on a carrier such as a disk, CD- or DVD-ROM, programmed memory such as non-volatile memory (e.g. Flash) or read-only memory (Firmware). Code (and/or data) to implement embodiments of the invention may comprise source, object or executable code in a conventional programming language (interpreted or compiled) such as C, or assembly code. As the skilled person will appreciate such code and/or data may be distributed between a plurality of coupled components in communication with one another.

BRIEF DESCRIPTION OF DRAWINGS

The invention is diagrammatically illustrated, by way of example, by the following drawings, in which:

FIG. 2 is a flowchart illustrating how remote control of the computer illustrated in FIG. 1 is achieved;

DETAILED DESCRIPTION OF DRAWINGS

Figure 1:
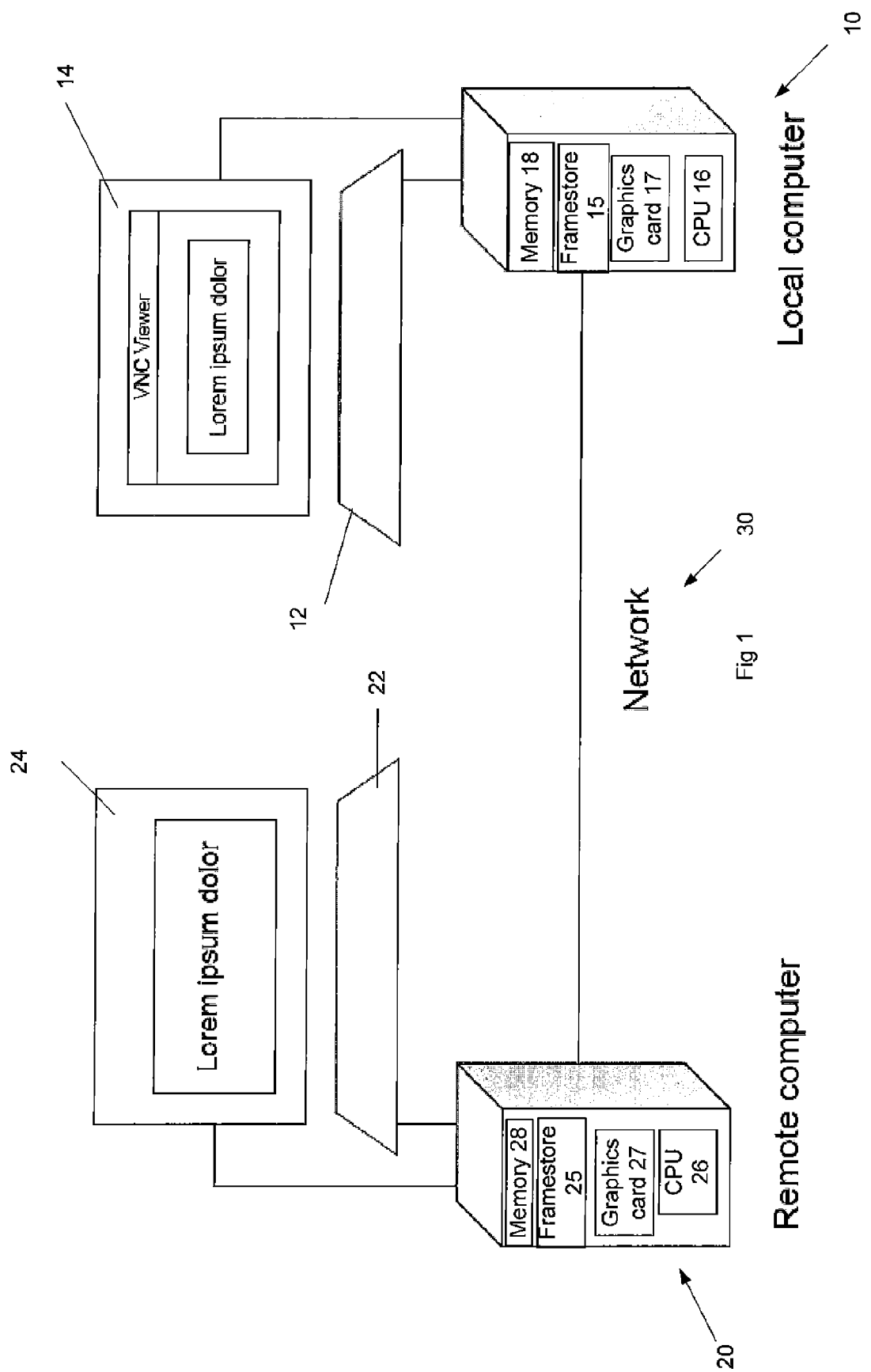
FIG. 1 illustrates a system comprising a pair of computers connected over a network to allow remote control.

FIG. 1 shows a remote computing system comprising a local computer 10 at which a user is located connected via a network 30 to another computer 20 at a location which is physically remote from the user. The local computer comprises a keyboard 12 (or other similar input device, e.g. mouse), a central processing unit 16, memory 18 and a display 14 (optionally) driven by a graphics card 17 with data from an optional framestore. Similarly, the remote computer 20 comprises standard components such as a keyboard 22, a central processing unit 26, memory 28 and a display 24 (optionally) driven a graphics card 27 with data from an optional framestore. It will be appreciated that the computers do not need to be the same type or may be replaced with similar electronic devices, e.g. PDAs, mobile phones etc. The network 30 may be any suitable network, e.g. via the Internet or may be an internal business computer network. Similarly, the graphics card may be optional and the system may use any suitable method of producing images, e.g. the CPU may produce the image directly from the data stored in memory, e.g. in the framestores.

The general process for remote computing is illustrated in FIG. 2. In the following description the control programs are referred to as VNC viewer and VNC server programs but any technology that allows remote computing may be used. The CPU on the remote computer runs a VNC® Server program (or similar program) at the same time as the CPU on the local computer running a complementary VNC® viewer program (or similar program). As shown in the flowchart, any program on the remote computer can be controlled. The first step is for the CPU 26 on the remote computer 20 to interact with the graphics card 27 on the remote computer. Under the control of the VNC® Server program, the CPU 26 on the remote computer gets a frame buffer for the display (e.g. by linking to the graphics card 27 or a virtual graphics card such as an X server) to create a pixel buffer (stored in memory 28) containing a copy of the information shown on the display 24 of the remote computer. The next step is for the CPU under the control of the VNC® Server program to encode the pixel buffer as detailed below. Once the initial display has been encoded, thereafter the CPU 26 need only encode changed regions of the display 24 on the remote computer. The encoded pixel buffer data (and later updated pixel buffer data) is sent via the network to the local computer 10.

The encoded pixel buffer data received from the remote computer 20 is stored on the local computer 10, e.g. in memory 18 in a local pixel buffer. Under the control of the VNC® Viewer program, the CPU 16 on the local computer, decodes the encoded pixel buffer data and sends the decoded data, for example via the graphics card 17, for display. In this way, the display 14 on the local computer 10 shows an updated copy of the display information currently showing on the display of the remote computer 20.

Figure 3A:
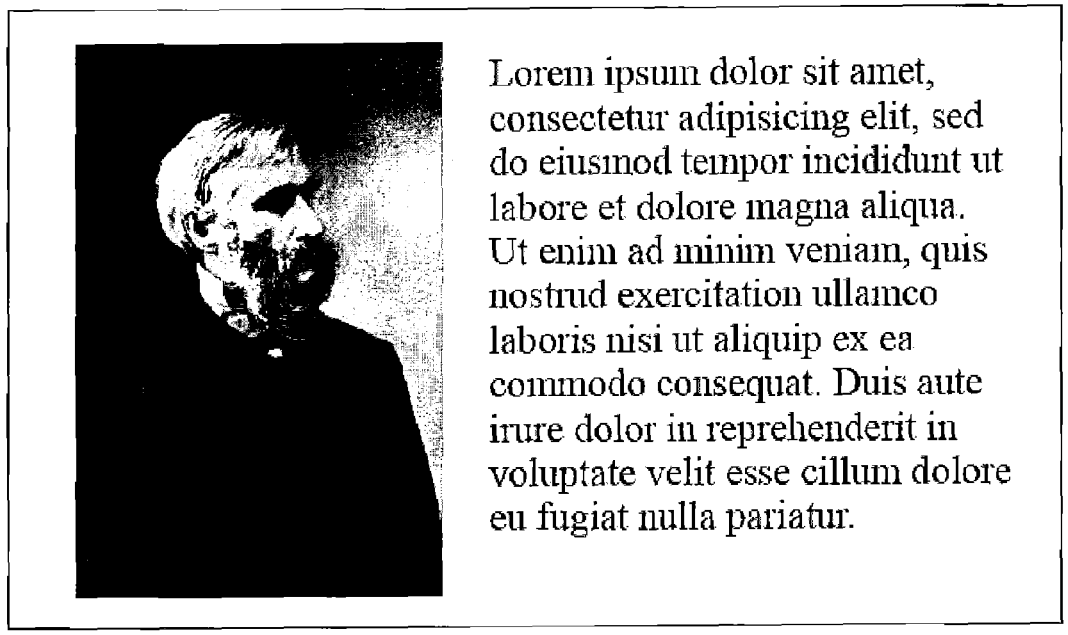
FIG. 3a is a screenshot of a display on the screen of the pair of computers.
Figure 3B:
FIG. 3b is the image of FIG. 3a overlaid with a grid.

As shown in more detail in FIGS. 3a and 3b, the displayed information is a mixture of different types of data, namely images (such as photographs or other real-world imagery) and text. An ideal encoding would:

(i) produce a copy of the remote display that has no perceptible difference from the remote display itself, (ii) be fast to encode and decode, and (iii) produce a small amount of encoded data.

The extent to which an encoding meets these criteria depends on the type of pixel data being encoded. Pixel data for images (image pixel data) typically varies smoothly over the region on which it is defined. By contrast, pixel data for text (text pixel data), typically varies infrequently and sharply over the region on which it is defined. Text pixel data may often represent text or other user interface elements such as buttons, menus and dialog boxes.

The applicant has investigated the differences between the various types of encoding. Lossless encodings, such as ZRLE (see definitions below), meet criterion (i) perfectly and criterion (ii) relatively poorly for both types of pixel data. Such lossless encodings also meet criterion (iii) well on text pixel data but very poorly on image pixel data. By contrast, lossy encodings, such as JPEG, meet criterions (i) and (iii) well on image pixel data and poorly on text pixel data and meet criterion (ii) well for both types of data.

The applicant has recognized that it is not necessary to use the same encoding for all parts of the display. Accordingly, as shown in FIG. 3b, a grid of tiles is overlaid on the display and each tile is categorized as "image" or "text". A typical grid may have tiles having 16 by 16 pixels but other sizes of grids may be used. The grids may overlap. Furthermore, although the tiles are shown as rectangles, other shapes of tiles may be used. The grid is overlaid over all the display but in practice, a grid will only be laid over a region which has changed. In FIG. 3b, "image" tiles are marked with an "I", and "text" tiles are marked with a "T".

Figure 4:
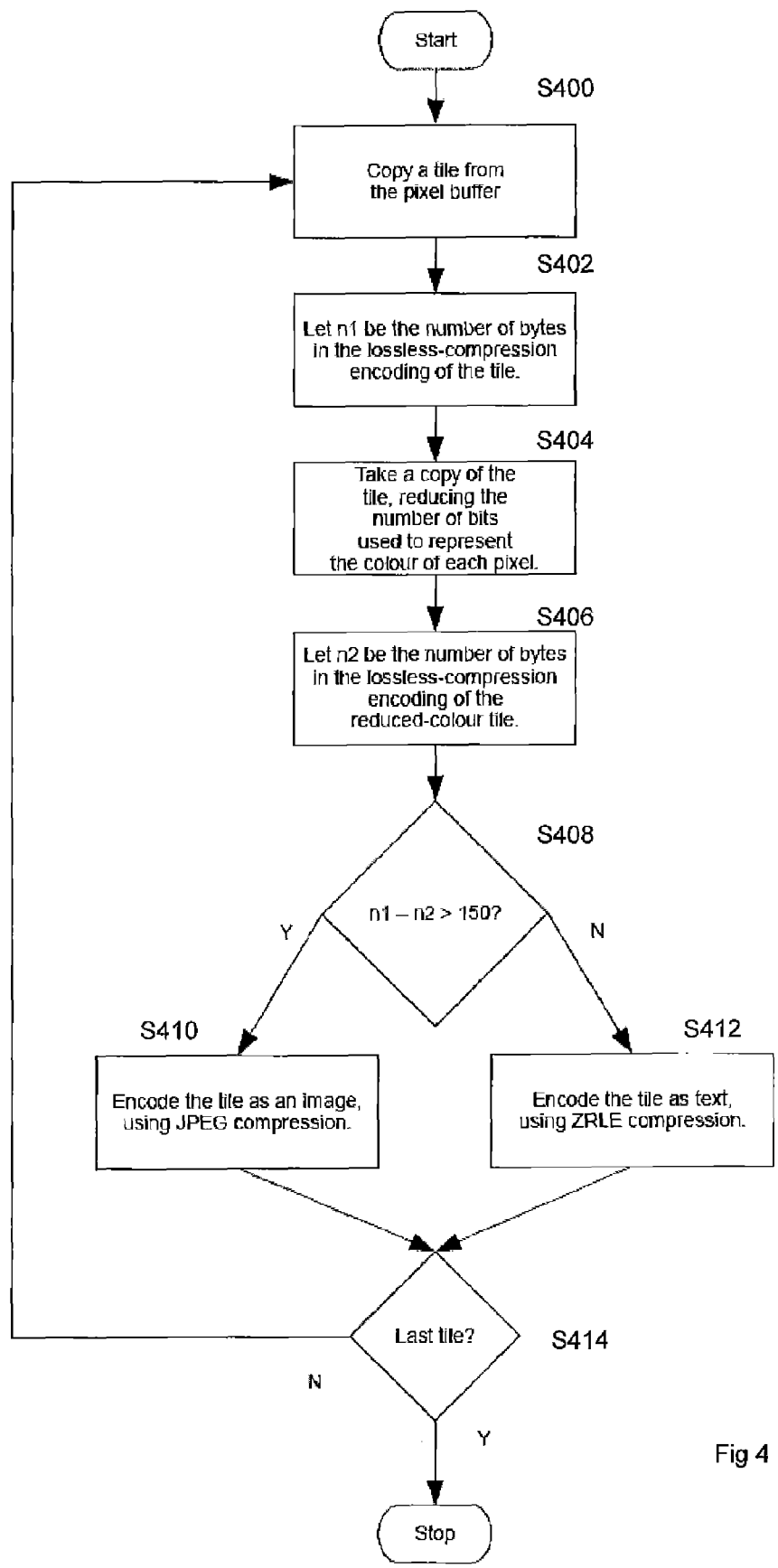
FIG. 4 is a flowchart of the process for improving the performance of the system of FIG. 1.

The process for categorizing a tile and its subsequent encoding is shown in FIG. 4. The algorithm that categorizes each tile as "image" or "text" relies on the fact that an "image" tile generally contains a greater number of different pixel values than a "text" tile. There are many ways of making use of this fact. In the present invention, this fact is used in combination with the fact that neighboring pixels in an "image" tile often have pixel values that are close to each other. A consequence of this is that if the number of bits used to represent each pixel value is reduced, many neighboring pixels in an "image" tile will have the same pixel value, when they had different pixel values before the bit-depth reduction. This means that any lossless encoding that is based on run-length encoding will compress the amount of encoded data to a greater extent in the post-reduction "image" tile than in the pre-reduction "image" tile. In contrast, the reduction will not affect the compression produced by a lossless encoding applied to a "text" tile. Other means for detecting "image" or "text" data may be used, perhaps using statistical analysis of each tile, e.g. using histograms of the colors used. For example, if 80% or more of the pixel values lay within 1% of the available color values in a tile, the tile is text.

The first step S400 is to copy a tile from the pixel buffer on the remote computer. At step S402, the lossless encoding (e.g. TRLE encoding) is applied to the tile to compress the data and the number of bytes of data produced by this encoding is recorded as n1. The next step S404 is to take a copy of the same time and reduce the number of bits used to represent the color of each pixel. This can be achieved by any standard technique or determined heuristically as described below. At step S406, the process then applies the lossless encoding to the tile with reduced bit depth to compress the data and the number of bytes of data produced by this encoding is recorded as n2. n1 is compared with n2 at step S408. If the difference between the two numbers exceeds a certain threshold, which was determined heuristically (e.g. as shown in FIG. 4 is assumed to be 150), the tile is categorized as "image" and as shown at step S410, the tile is encoded using a lossy compression such as JPEG. If the difference is less than the threshold, the tile is categorized as "text" and the tile is encoded using a lossless compression such as ZRLE. At step S414 the process determines whether or not the last tile has been encoded; if not steps S400 to S414 are repeated until all the grid is encoded.

The encoded grid is then transmitted as a sequence of encoded tiles to the local computer for decoding as described above. To enable the decoding, each encoded tile is preceded with a flag indicating which encoding has been used on the tile, e.g. a flag saying "JPEG-encoded" or "ZRLE-encoded".

The precise algorithms used for lossless encoding to achieve the compression or for color reduction are not important provided the lossless compression is able to detect and optimize regions of constant color (this is a feature of most such techniques).

The optimal bit-depth reduction may be determined heuristically as follows. Let n be the total number of bits used to represent each pixel value in the original pixel data. That is, n should be the sum of the number of bits used to represent the red, the green, and the blue components of each pixel value. The reduced bit-depth pixel values should use the largest integer less than or equal to (n+5)/6 as the number of bits in each of the red, green, and blue components. For example, if the original pixel data uses 8 bits to represent each of the red, the green, and the blue components of each pixel value, the reduced bit-depth pixel values should use 4 bits to represent each of the red, the green, and the blue components of each pixel value, because 4 is the largest integer less than or equal to (8+8+8+5)/6.

The optimal threshold for the difference between the numbers of bytes of encoded data, before and after bit-depth reduction is found heuristically and is related to the total number of bits (n) used to represent each pixel value in the original pixel data. If n is 24, the threshold should be 150. If n is 16, the threshold should be 50. If n is less than 16, the threshold should be 50*(n/16). If n is greater than 16, then the threshold should be found by linear interpolation/extrapolation, between the values of 50 (for n=16) and 150 (for n=24).

No doubt many other effective alternatives will occur to the skilled person. It will be understood that the invention is not limited to the described embodiments and encompasses modifications apparent to those skilled in the art lying within the spirit and scope of the claims appended hereto.

DEFINITIONS

JPEG is a well-known technique of lossy compression. The term "JPEG" is an acronym for the Joint Photographic Experts Group which created the standard.

RLE is a well-known technique for lossless compression. The data consists of a number of runs, repeated until the tile is done. Each run is a represented by a single pixel value followed by the length of the run. The length is represented as one or more bytes.

TRLE is a variation of RLE and stands for Tiled Run-Length Encoding. It combines tiling, palettization and run-length encoding. The rectangle is divided into tiles of 16×16 pixels in left-to-right, top-to-bottom order. TRLE makes use of a new type CPIXEL (compressed pixel). This is the same as a PIXEL for the agreed pixel format, except as a special case, it uses a more compact format if true-color-flag is non-zero, bits-per-pixel is 32, depth is 24 or less and all of the bits making up the red, green and blue intensities fit in either the least significant 3 bytes or the most significant 3 bytes. If all of these are the case, a CPIXEL is only 3 bytes long, and contains the least significant or the most significant 3 bytes as appropriate. bytesPerCPixel is the number of bytes in a CPIXEL.

Each tile begins with a subencoding type byte. The top bit of this byte is set if the tile has been run-length encoded, clear otherwise. The bottom seven bits indicate the size of the palette used: zero means no palette, one means that the tile is of a single color, and 2 to 127 indicate a palette of that size. The special subencoding values 129 and 127 indicate that the palette is to be reused from the last tile which had a palette, with and without RLE respectively.

ZRLE stands for Zlib Run-Length Encoding, and combines an encoding similar to TRLE with zlib compression. On the wire, the rectangle begins with a 4-byte length field, and is followed by that many bytes of zlib-compressed data. A single zlib "stream" object is used for a given RFB protocol connection, so that ZRLE rectangles must be encoded and decoded strictly in order.

The zlibData when uncompressed represents tiles in left-to-right, top-to-bottom order, similar to TRLE, but with a tile size of 64×64 pixels. If the width of the rectangle is not an exact multiple of 64 then the width of the last tile in each row is smaller, and if the height of the rectangle is not an exact multiple of 64 then the height of each tile in the final row is smaller.

The tiles are encoded in exactly the same way as TRLE, except that subencoding may not take the values 127 or 129, i.e. palettes cannot be reused between tiles. The server flushes the zlib stream to a byte boundary at the end of each ZRLE encoded rectangle. It need not flush the stream between tiles within a rectangle. Since the zlibData for a single rectangle can potentially be quite large, clients can incrementally decode and interpret the zlibData but must not assume that encoded tile data is byte aligned.

The invention claimed is:

1. A method of transmitting display data from a remote computer to a local computer having a display whereby a user is able to view said remote computer display data on said local computer display, the method comprising:

dividing at least part of the remote computer display data into a plurality of tiles;

determining whether each tile represents image data or text data by applying a color reduction algorithm to each said tile to produce a color-reduced tile and comparing each tile with its corresponding color reduced tile;

encoding each tile representing text data using a lossless compression; and encoding each tile representing image data using a lossy compression;

wherein said transmitted display data comprises said lossy encoded image data and said lossless encoded text data; and wherein said determining step comprises:
compressing each said tile using a lossless compression to produce a first encoded copy;
compressing said color reduced tile with said lossless compression used in said first encoding step to produce a second encoded copy; and
comparing said first and second encoded copies to determine whether said tile represents image data or text data, wherein a tile represents image data if the size of the first encoded copy is large relative to the size of the second encoded copy and a tile represents text data if the sizes are approximately equal.

2. A method according to claim 1, wherein said determining step comprises determining whether each tile represents image data or text data by considering color data for each tile.

3. A method according to claim 1, wherein said comparing step comprises determining whether the difference in size between said first encoded copy and said second encoded copy is greater than a threshold value, wherein a tile represents image data if the threshold value is exceeded and a tile represents text data if the threshold value is not exceeded.

4. A method according to claim 3, wherein said display data is in the form of pixel data with n being the total number of bits used to represent each pixel in the original pixel data and wherein said threshold value is determined from n.

5. A method according to claim 1, wherein said lossless compression used in each said compressing step is TRLE.

6. A method according to claim 1, wherein said display data is in the form of pixel data with n being the total number of bits used to represent each pixel in the original pixel data and wherein said color-reduction algorithm reduces the total number of bits used to represent each pixel.

7. A method according to claim 1, wherein said lossless compression in said encoding step is a variation of RLE.

8. A method according to claim 7, wherein said variation is ZRLE.

9. A method according to claim 1, wherein said lossy compression is JPEG.

10. A method according to claim 1, wherein said plurality of tiles form a grid.

11. A method according to claim 1, comprising determining which regions of the remote computer display data have changed and wherein said at least part of the remote computer display data comprises said regions which have changed.

12. A method according to claim 11, comprising discarding said changes that have been superseded by newer changes, until a request is received from said local computer.

13. A method of controlling a remote computer from a local computer, the method comprising linking said local computer and said remote computer, inputting commands in said local computer, transmitting said commands from said local computer to said remote computer to take effect on said remote computer, and transmitting display data from said remote computer as claimed in claim 1.

14. A non-transitory carrier carrying processing code for implementing the method of claim 1 on a computer.

15. A remote computer comprising a processor which is configured to create display data for said remote computer, said remote computer being connected via a network to a local computer comprising a processor and a display, wherein the processor of the remote computer is configured to:
divide at least part of the remote computer display data into a plurality of tiles;
determine whether each tile represents image data or text data by applying a color reduction algorithm to each said tile to produce a color-reduced tile and comparing each tile with its corresponding color reduced tile;
encode each tile representing text data using a lossless compression;
encode each tile representing image data using a lossy compression; and
transmit display data comprising said lossy encoded image data and said lossless encoded text data from said remote computer to said local computer, whereby a user is able to view said remote computer display data on said local computer display;
wherein said determining step comprises:
compressing each said tile using a lossless compression to produce a first encoded copy;
compressing said color reduced tile with said lossless compression used in said first encoding step to produce a second encoded copy; and
comparing said first and second encoded copies to determine whether said tile represents image data or text data, wherein a tile represents image data if the size of the first encoded copy is large relative to the size of the second encoded copy and a tile represents text data if the sizes are approximately equal.

16. A remote computing system comprising:
a local computer having a processor and a display;
a remote computer having a processor; and
a network linking said local computer and said remote computer, wherein the processor of the remote computer is configured to:
create display data for said remote computer;
divide at least part of the remote computer display data into a plurality of tiles;
determine whether each tile represents image data or text data by applying a color reduction algorithm to each said tile to produce a color-reduced tile and comparing each tile with its corresponding color reduced tile;
encode each tile representing text data using a lossless compression;
encode each tile representing image data using a lossy compression; and
transmit display data comprising said lossy encoded image data and said lossless encoded text data from said remote computer to said local computer;
wherein said processor of said local computer is configured to decode said transmitted display data and to display on said local computer display said remote computer display; and
wherein said determining step comprises:
compressing each said tile using a lossless compression to produce a first encoded copy;
compressing said color reduced tile with said lossless compression used in said first encoding step to produce a second encoded copy; and
comparing said first and second encoded copies to determine whether said tile represents image data or text data, wherein a tile represents image data if the size of the first encoded copy is large relative to the size of the second encoded copy and a tile represents text data if the sizes are approximately equal.

* * * * *